United States Patent
McGinnis et al.

(10) Patent No.: US 8,612,832 B2
(45) Date of Patent: Dec. 17, 2013

(54) MECHANISMS AND TECHNIQUES FOR PROVIDING CACHE TAGS IN DYNAMIC RANDOM ACCESS MEMORY

(75) Inventors: Darrell S. McGinnis, Cornelius, OR (US); C. Scott Huddleston, Beaverton, OR (US); Rajat Agarwal, Beaverton, OR (US); Meenakshisundaram R. Chinthamani, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 170 days.

(21) Appl. No.: 13/078,704

(22) Filed: Apr. 1, 2011

(65) Prior Publication Data

US 2012/0254700 A1 Oct. 4, 2012

(51) Int. Cl.
G11C 29/00 (2006.01)

(52) U.S. Cl.
USPC .......................................................... 714/773

(58) Field of Classification Search
USPC ........................................................... 714/773
See application file for complete search history.

(56) References Cited

U.S. PATENT DOCUMENTS

| | | | |
|---|---|---|---|
| 6,094,711 A * | 7/2000 | Wong | 711/169 |
| 7,437,597 B1 * | 10/2008 | Kruckemyer et al. | 714/6.11 |
| 2006/0143509 A1 * | 6/2006 | Okawa | 714/11 |

* cited by examiner

*Primary Examiner* — M. Mujtaba K Chaudry
*Assistant Examiner* — Enam Ahmed
(74) *Attorney, Agent, or Firm* — Blakely, Sokoloff, Taylor & Zafman LLP

(57) ABSTRACT

A dynamic random access memory (DRAM) is operated as a cache memory coupled with a processor core. A block of data is transmitted to the DRAM as even and odd pairs of bits from the processor core. The block of data includes N error correcting code (ECC) bits and 11*N data bits. Two or more cache lines are to be stored in a memory page with tag bits aggregated together within the page.

26 Claims, 3 Drawing Sheets

FIG. 2

MECHANISMS AND TECHNIQUES FOR PROVIDING CACHE TAGS IN DYNAMIC RANDOM ACCESS MEMORY

TECHNICAL FIELD

Embodiments of the invention relate to use of dynamic random access memory (DRAM) as cache memory. More specifically, embodiments of the invention relate to techniques for providing cache tags in standard DRAM that is used as a cache memory.

BACKGROUND

The general use of cache memory systems has been known in the computing technologies for years. Current cache memory systems are typically multi-level cache systems in which the different cache levels are different sizes and are physically located in different places. In some larger systems dynamic random access memory (DRAM) may be utilized as at least one level of the cache memory system.

One challenge associated with cache memory structures is that information associated with a tag line, for example, tags, must also be stored. For dedicated hardware cache memory structures, this associated information may be stored separately from the corresponding cache lines. However, this strategy may prevent standard DRAM modules from being used in cache memory systems.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 2 is a conceptual diagram of one memory organization that may be utilized with the data configuration of FIG. 1.

DETAILED DESCRIPTION

Figure 1:
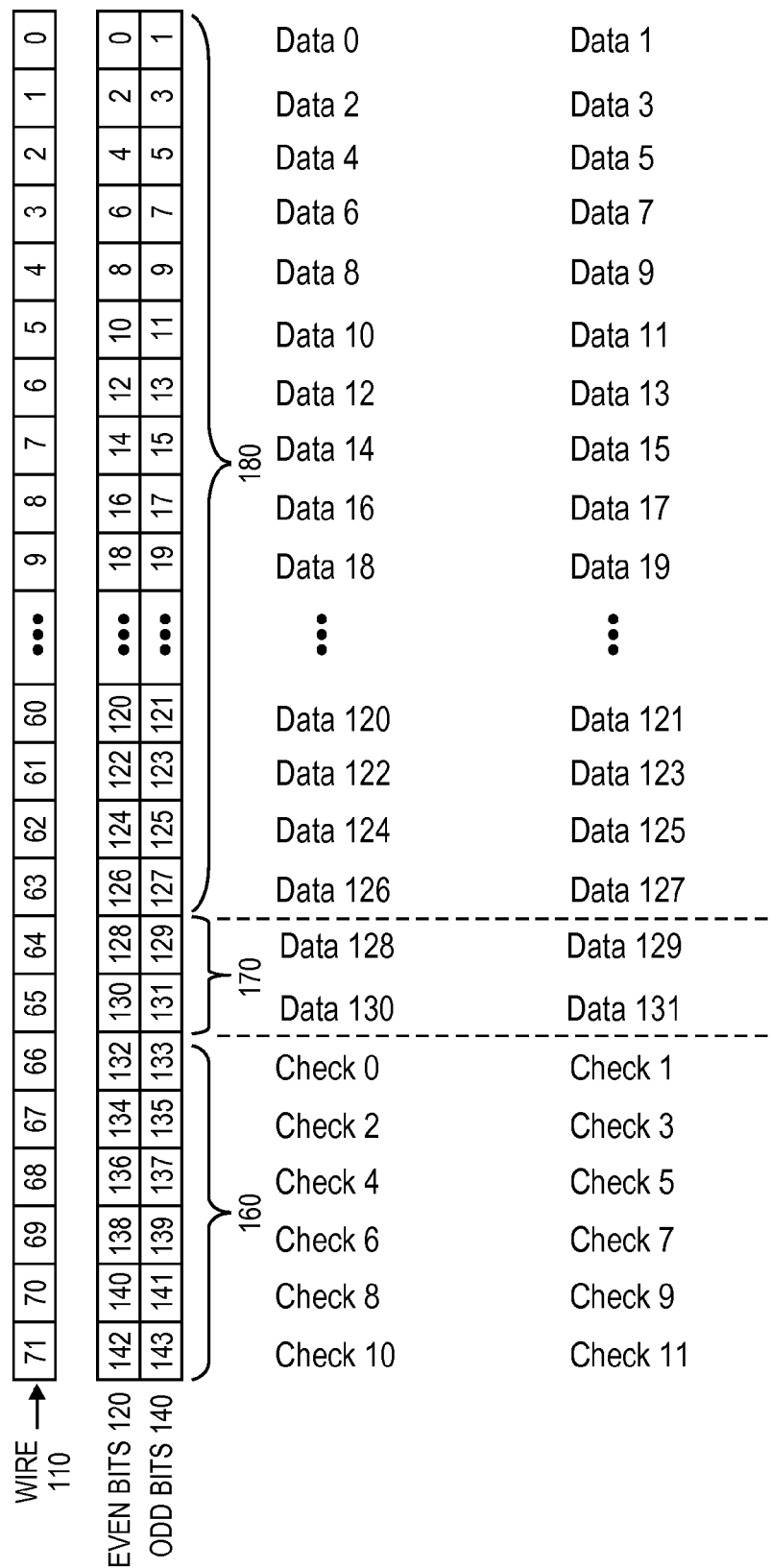
FIG. 1 is a conceptual illustration of one embodiment of a data arrangement that may be utilized for transmitting cache lines of data to and from a physical memory device.

In the following description, numerous specific details are set forth. However, embodiments of the invention may be practiced without these specific details. In other instances, well-known circuits, structures and techniques have not been shown in detail in order not to obscure the understanding of this description.

Caches traditionally require separate or segregated storage for cache tags. Separate tag and data stores often utilize different ECC schemes due to optimized memory organizations. Separate tag store requires separate control logic and associated data paths and power requirements.

Utilizing DRAM as cache memory typically does not exist because it is difficult to use efficiently as cache memory and DRAM is not well suited to be reconfigured as scratch memory or fast system memory due to complexities in a controller that supports a separate tag store. Additionally, tag store is often highly specialized memory that provides no value if the data store is reconfigured away from cache usage.

Techniques described herein provide the ability to utilize a new memory hierarchy transparently as cache memory and allows the new memory hierarchy to be reconfigured as scratch/fast memory as workloads and/or operating systems support fast/scratch memory. Described herein are techniques to utilize 72-byte Error Correcting Code (ECC) support without requiring changes for cache usage. This may result in a simplified memory controller architecture while supporting both cache and non-cache usages.

More specifically, the techniques described herein support implementation of a cache memory that may utilize standard dynamic random access memory (DRAM) modules and stores data and tags in the same memory page. Traditional caches use special tag storage that stores tags separately and does not allow tag or data storage to be reconfigured as scratch/fast system memory. A new and more efficient ECC code may be used for cache data in order to free bits (that had been used as ECC bits) for use as tag storage.

In one embodiment, a new data arrangement within the cache data memory page may be used to aggregate the tag bits together for storage. In one embodiment, specific cache organizations and transaction flows are utilized to efficiently fetch tags of a cache set at one time and provide optimized accesses for subsequent cache data accesses.

External memories typically support Single x4 Error Correction-Double x4 Error Detection (S4EC/D4ED) or "Chip-kill." This protects a data word that is 144 bits wide an stored across a "rank" that includes 36×4-bit devices if the 144 bits are 128 data bits and 16 check bits. In a monolithic memory a single die provides the data word. In these cases a chip fail scheme is not necessary, but Single Error Correction-Double Error Detection (SEC/DED) ECC may still be provided.

In one embodiment, a 72-bit data bus may be used with 8-bit bursts to transfer a 64-byte cache line. In one embodiment, wire SEC/DED may be provided. That is any single wire fault of the 72-bit bus is correctable and any second wire fault is detectable. A single wire fault can result in three cases of bit errors for even/odd bit pairs that share a common wire. In one embodiment, a 144-bit may be striped into a 72-bit data bus with the ECC codes as illustrated in FIG. 1.

FIG. 1 is a conceptual illustration of one embodiment of a data arrangement that may be utilized for transmitting cache lines of data to and from a physical memory device. In the example of FIG. 1, if a wire has a failure (e.g., a stuck-at fault), any of the following may occur: 1) no error with both even/odd data values match the failed value; 2) single bit error when either even or odd data values match the failed value; 3) double bit error when neither even/odd data values match the failed value. All combinations are correctable.

A second wire fault will generate similar cases and all combinations of the original wire bit errors with the second wire bit error cases are detectable without aliasing. In one embodiment, the SEC-DED code is constrained to a modified Hamming code using 12 bits to allow for four extra bits to be available for data in each data word compared to the traditional chip-kill codes.

In one embodiment, a wire error code is a bit error code or the XOR of the two bit error code pairs for a given wire. Wire error codes are unique for a wire fault to be correctable. Also, the XOR of any two-wire error codes from distinct wires cannot be another wire error code. Otherwise, some double wire faults would not be detected.

With these constraints, a sufficient ECC code can be constructed. Each 12-bit bit error code can be considered a base-4 number, and the 12-bit space can be partitioned by non-zero leading digits.

TABLE 1

| P1 | P2 | P3 | |
|---|---|---|---|
| 1XXXXX | 2XXXXX | 3XXXXX | 1,024 in each of P1, P2 and P3 1k^2 pair possibilities. |
| 01XXXX | 02XXXX | 03XXXX | 256 in each of P1, P2 and P3, 64k pair possibilities. |
| 001XXX | 002XXX | 003XXX | 32 in each of P1, P2 and P3 |
| 0001XX | 0002XX | 0003XX | 16 in each of P1, P2 and P3 |
| 00001X | 00002X | 00003X | |
| 000001 | 000002 | 000003 | |
| 000000 | 000000 | 000000 | |

To generate wire error codes for a given wire, a value is chosen from P1 and P2 in the same row for the bit error codes, and the values are XORed, which will be in the P3 space for that row. This gives the final wire error code. A search program may be utilized to search for bit error code pairs such that the resulting wire error codes satisfy the SEC-DED constraints discussed above. In one embodiment 72 pairs are utilized to provide the desired level of ECC protection.

Referring back to FIG. 1, data bits 180 can provide 128 bits of data over wire 110 using even bits 120 and odd bits 140. Similarly, ECC protection may be provided with 12 check bits 160 also over wire 110 using even bits 120 and odd bits 140. This allows additional data bits 170 to provide 4 bits of data over wire 110 using even bits 120 and odd bits 140. In one embodiment, data bits 170 may be used for cache tag information.

Figure 2:
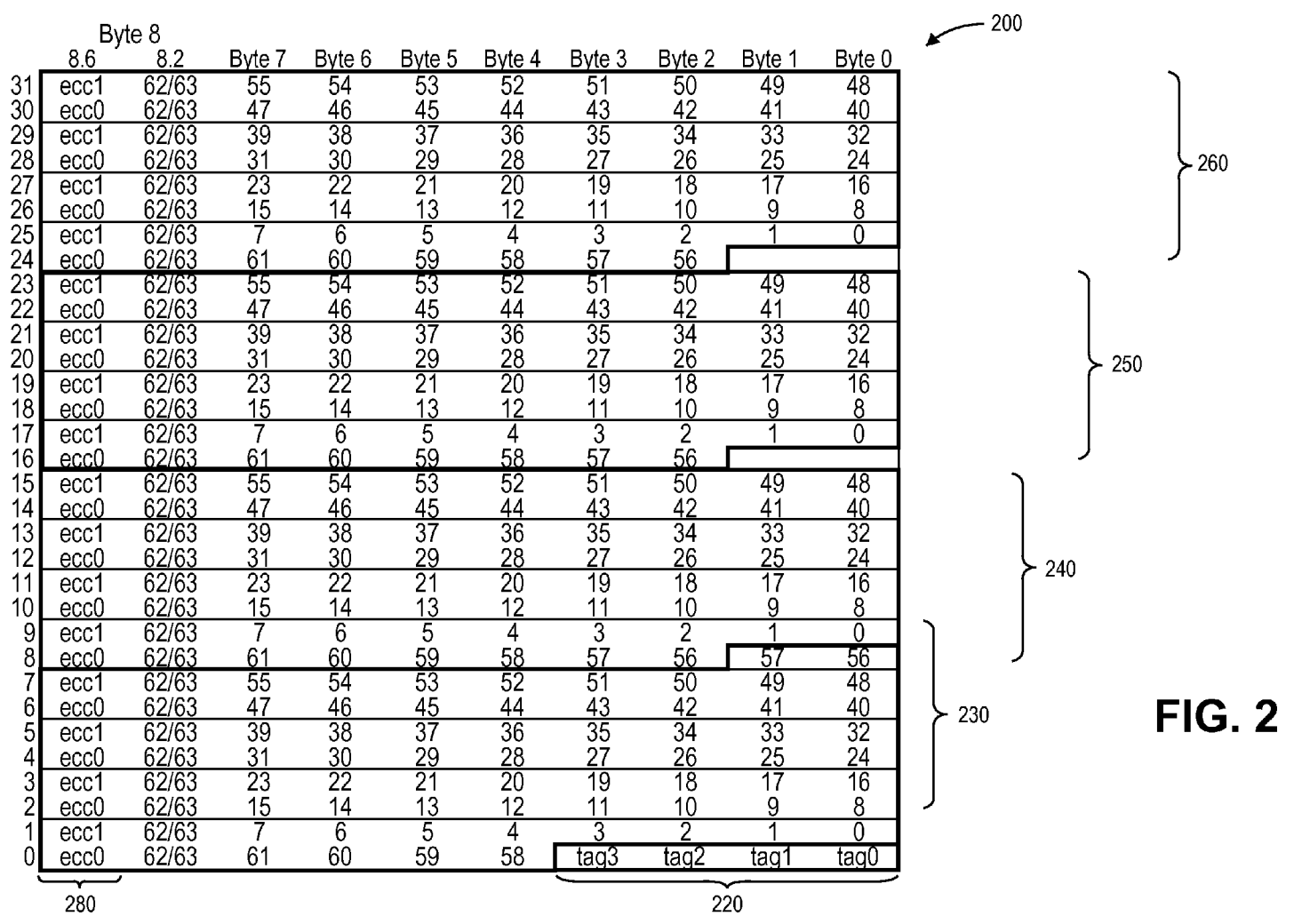

FIG. 2 is a conceptual diagram of one memory organization that may be utilized with the data configuration of FIG. 1. FIG. 2 illustrates a 256-byte memory page that may hold four 64-byte lines and associated 12-byte ECC bits per 16 bits of data. Using a traditional organization and the data configuration of FIG. 1, there would be four unused bits per 16-byte data word distributed evenly with the data words. Other memory page sizes, line sizes, data sizes, etc can be supported.

In the example of FIG. 2, memory page 200 includes four cache lines (e.g., 230, 240, 250 and 260) as well as ECC bits 280 and cache tag bits 220. The same data bits can be utilized in different organizations.

For a caching organization, it would be desirable to have all of the tag bits together to provide more efficient fetching of tags required for a lookup. Using the 12-byte ECC approach, there will be 16 spare bits per 64-byte line, providing 64 bits for tag storage for the four cacheline memory page.

The data organization of FIG. 2 provides an aggregation of 32 bits to accommodate tags in the first data word of the memory page. The remaining bits of the memory page are assigned to data and ECC such that hardware requirements are simplified for unpacking of data and ECC when accessing any of the four 64-byte lines.

With the organization of FIG. 2, the tags can be fetched in on short access and the remaining data words of any 64-byte line are accessible in at most four additional data words. In this organization, a minimum set of byte lanes requires simple hardware to accommodate tag or 64-byte line data. This organization is usable for non-cache uses with only small penalties that occur when accessing one of four 64-byte lines. In the example of FIG. 2, unused spares may be utilized in a way to minimize hardware requirements. The concept of aggregating spare bits to the front of the page may be extended for variations in tag size and line size.

Figure 3:
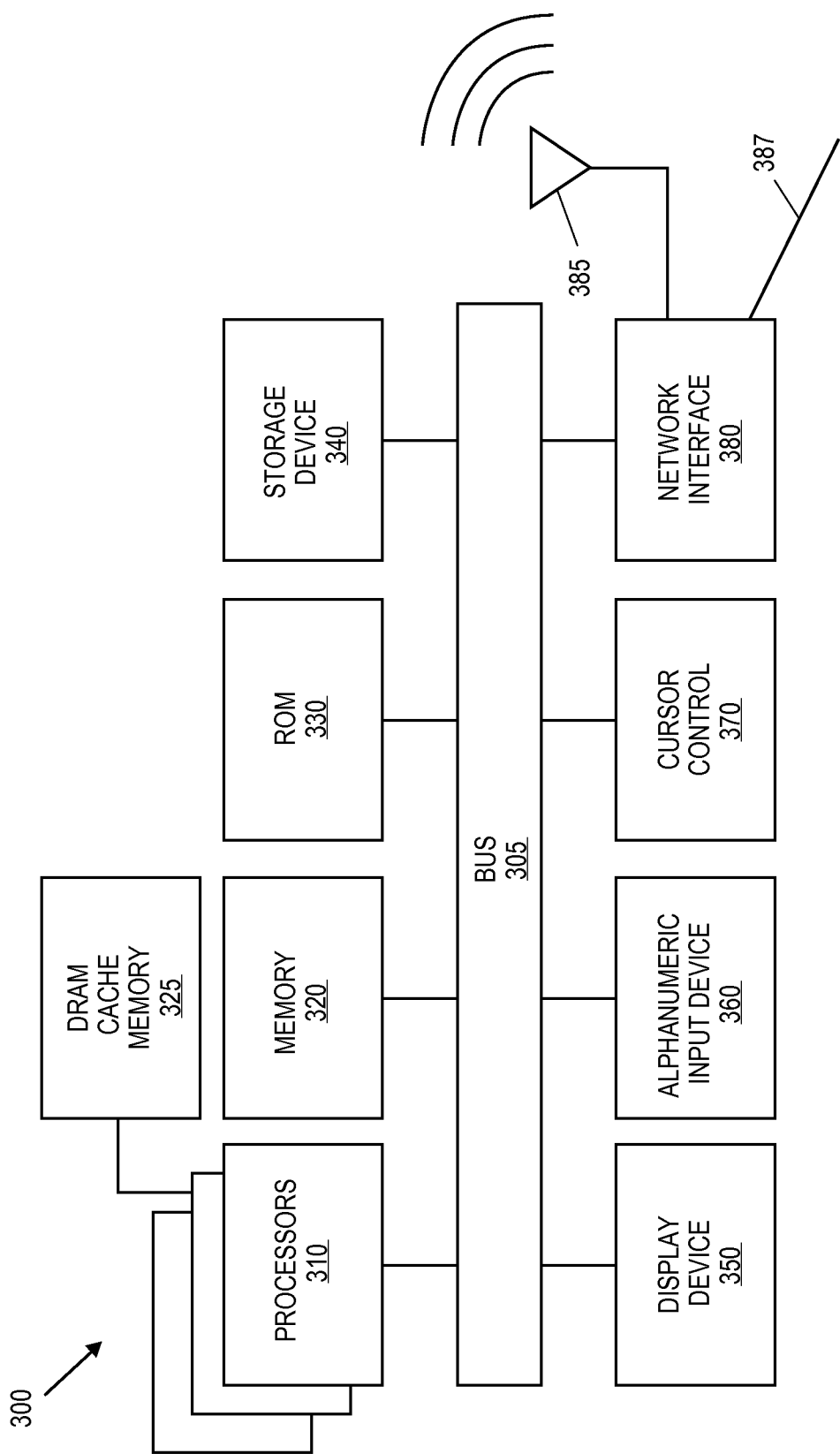
FIG. 3 is a block diagram of one embodiment of an electronic system.

In one embodiment, the DRAM memory that is used as a memory cache is outside of a processor coherency domain and may support memory consistency and my use the MEI model. Using the organization of FIG. 2, tag lookups and updates are in the same page as well as cached data fills, hits and evict accesses. Utilizing a page open policy for near memory scheduling allows relatively low power and relatively FIG. 3 is a block diagram of one embodiment of an electronic system. The electronic system illustrated in FIG. 3 is intended to represent a range of electronic systems (either wired or wireless) including, for example, desktop computer systems, laptop computer systems, cellular telephones, personal digital assistants (PDAs) including cellular-enabled PDAs, set top boxes, tablet devices, etc. Alternative electronic systems may include more, fewer and/or different components.

Electronic system 300 includes bus 305 or other communication device to communicate information, and processor 310 coupled to bus 305 that may process information. While electronic system 300 is illustrated with a single processor, electronic system 300 may include multiple processors and/or co-processors. Electronic system 300 further may include random access memory (RAM) or other dynamic storage device 320 (referred to as main memory), coupled to bus 305 and may store information and instructions that may be executed by processor 310. Main memory 320 may also be used to store temporary variables or other intermediate information during execution of instructions by processor 310.

In one embodiment, electronic system 300 includes DRAM cache memory 325 coupled with one or more of processor(s) 310. DRAM cache memory 325 may be configured to operate in the manner described above to provide cache memory to one or ore of processor(s) 310 with a memory device that is external to the processor(s).

Electronic system 300 may also include read only memory (ROM) and/or other static storage device 330 coupled to bus 305 that may store static information and instructions for processor 310. Data storage device 340 may be coupled to bus 305 to store information and instructions. Data storage device 340 such as a magnetic disk or optical disc and corresponding drive may be coupled to electronic system 300.

Electronic system 300 may also be coupled via bus 305 to display device 350, such as a cathode ray tube (CRT) or liquid crystal display (LCD), to display information to a user. Alphanumeric input device 360, including alphanumeric and other keys, may be coupled to bus 305 to communicate information and command selections to processor 310. Another type of user input device is cursor control 370, such as a mouse, a trackball, or cursor direction keys to communicate direction information and command selections to processor 310 and to control cursor movement on display 350.

Electronic system 300 further may include network interface(s) 380 to provide access to a network, such as a local area network. Network interface(s) 380 may include, for example, a wireless network interface having antenna 385, which may represent one or more antenna(e). Network interface(s) 380 may also include, for example, a wired network interface to communicate with remote devices via network cable 387, which may be, for example, an Ethernet cable, a coaxial cable, a fiber optic cable, a serial cable, or a parallel cable.

In one embodiment, network interface(s) 380 may provide access to a local area network, for example, by conforming to IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11:

Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 380 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   a processor core;
   a bus coupled to the processor core;
   a dynamic random access memory (DRAM) coupled with the processor core via the bus, the DRAM to operate as a cache memory for the processor core, the processor core to transmit to the DRAM a block of data as even and odd pairs of bits, the block of data having N error correcting code (ECC) bits and 11*N data bits;
   wherein the processor core causes two or more cache lines to be stored in a memory page with tag bits aggregated together within the page;
   wherein each cache line comprises a block of data, the page of memory comprising tag bytes in a first portion of the page, and ECC bits for each cache line stored as a portion of every Mth byte of the page.

2. The apparatus of claim 1 wherein N equals 12.

3. The apparatus of claim 1 wherein the number of cache lines in the memory page is four.

4. The apparatus of claim 1, wherein ECC codes are constructed via a partitioned code space.

5. The apparatus of claim 4, wherein the partitioned code space is partitioned by leading non-zero digit values.

6. The apparatus of claim 5 wherein the number base is 4.

7. A method comprising:
   operating a dynamic random access memory (DRAM) as a cache memory coupled with a processor core;
   transmitting to the DRAM a block of data as even and odd pairs of bits with the processor core, the block of data having N error correcting code (ECC) bits and 11*N data bits; and
   causing two or more cache lines to be stored in a memory page with tag bits aggregated together within the page, wherein each cache line comprises a block of data, the page of memory comprising four tag bytes in a first portion of the page, and ECC bits for each cache line stored as a portion of every Mth byte of the page.

8. The method of claim 7 wherein N equals 12.

9. The method of claim 7 wherein the number of cache lines in the memory page is four.

10. The method of claim 7, wherein ECC codes are constructed via a partitioned code space.

11. The method of claim 10, wherein the partitioned code space is partitioned by leading non-zero digit values.

12. The method of claim 11 wherein the number base is 4.

13. An article of manufacture comprising a non-transitory computer-readable medium having stored thereon instructions that, when executed, cause one or more processors to:
   operate a dynamic random access memory (DRAM) as a cache memory coupled with a processor core;
   transmit to the DRAM a block of data as even and odd pairs of bits with the processor core, the block of data having N error correcting code (ECC) bits and 11*N data bits; and
   cause two or more cache lines to be stored in a memory page with tag bits aggregated together within the page, wherein each cache line comprises a block of data, the page of memory comprising four tag bytes in a first portion of the page, and ECC bits for each cache line stored as a portion of every Mth byte of the page.

14. The article of claim 13 wherein N equals 12.

15. The article of claim 13 wherein the number of cache lines in the memory page is four.

16. The article of claim 13, wherein ECC codes are constructed via a partitioned code space.

17. The article of claim 16, wherein the partitioned code space is partitioned by leading non-zero digit values.

18. The article of claim 17 wherein the number base is 4.

19. A system comprising:
   a transceiver having an antenna;
   a processor core coupled with the transceiver;
   a bus coupled to the processor core;
   a dynamic random access memory (DRAM) coupled with the processor core via the bus, the DRAM to operate as a cache memory for the processor core, the processor core to transmit to the DRAM a block of data as even and odd pairs of bits, the block of data having N error correcting code (ECC) bits and 11*N data bits;
   wherein the processor core causes two or more cache lines to be stored in a memory page with tag bits aggregated together within the page;
   wherein each cache line comprises a block of data, the page of memory comprising tag bytes in a first portion of the page, and ECC bits for each cache line stored as a portion of every Mth byte of the page.

20. The system of claim 19 wherein N equals 12.

21. The system of claim 20 wherein the processor core causes two or more cache lines to be stored in a memory page with tag bits aggregated together within the page.

22. The system of claim 21 wherein the number of cache lines in the memory page is four.

23. The apparatus of claim 1 where M equals eight.

24. The method of claim 7 where M equals eight.

25. The article of claim 13 where M equals eight.

26. The system of claim 19 where M equals eight.

* * * * *

UNITED STATES PATENT AND TRADEMARK OFFICE
CERTIFICATE OF CORRECTION

| | | |
|---|---|---|
| PATENT NO. | : 8,612,832 B2 | Page 1 of 1 |
| APPLICATION NO. | : 13/078704 | |
| DATED | : December 17, 2013 | |
| INVENTOR(S) | : McGinnis et al. | |

It is certified that error appears in the above-identified patent and that said Letters Patent is hereby corrected as shown below:

In the specification

Please insert in column 1, line 4

--STATEMENT OF GOVERNMENT INTEREST

This invention was made with Government support under contract number H98230-08-3-0011 awarded by the Department of Defense. The Government has certain rights in this invention.--

Signed and Sealed this
First Day of December, 2015

Michelle K. Lee
*Director of the United States Patent and Trademark Office*